United States Patent [19]
Bosschaerts et al.

[11] Patent Number: 5,783,356
[45] Date of Patent: Jul. 21, 1998

[54] HALFTONE REPRODUCTION BY SINGLE SPOT MULTIBEAM LASER RECORDING

[75] Inventors: Jacobus Bosschaerts; Robert Overmeer, both of Mortsel; Paul Delabastita, Antwerp; Johan Van Hunsel, Hasselt, all of Belgium

[73] Assignee: Agfa-Gevaert, N.V., Mortsel, Belgium

[21] Appl. No.: 812,451

[22] Filed: Mar. 6, 1997

Related U.S. Application Data

[60] Provisional application No. 60/015,618 Apr. 18, 1996.
[51] Int. Cl.$^6$ ............... G03F 7/22; G03F 7/07; G03F 7/20
[52] U.S. Cl. ............ 430/240; 430/204; 430/305; 430/394; 430/494; 430/945; 358/298; 358/475; 358/480
[58] Field of Search ............ 430/30, 204, 394, 430/494, 305, 945; 358/298, 475, 480

[56] References Cited

U.S. PATENT DOCUMENTS

| | | | |
|---|---|---|---|
| 5,627,007 | 5/1997 | Bergh | 430/394 |
| 5,635,318 | 6/1997 | Van Hunsel | 430/204 |
| 5,635,321 | 6/1997 | Van Hunsel et al. | 430/204 |
| 5,677,093 | 10/1997 | Delabastita et al. | 430/204 |

*Primary Examiner*—Richard L. Schilling
*Attorney, Agent, or Firm*—Baker & Botts, L.L.P.

[57] ABSTRACT

A method for generating a screened reproduction of a contone image comprises the steps of screening the contone image to obtain screened data representative for tones of the contone image and suitable for driving exposure of microdots on a radiation sensitive imaging element; exposing the microdots according to the screened data by at least one set or plurality (p) of radiation beams (b), characterized in that at a point in time (t) at least two radiation beams of the set of radiation beams impinge on a particular microdot (m) of a scanline (l). In particular is described a method for making a lithographic printing plate comprising the abovementioned steps.

2 Claims, 8 Drawing Sheets

HALFTONE REPRODUCTION BY SINGLE SPOT MULTIBEAM LASER RECORDING

DESCRIPTION

Benefit is claimed from provisional application Ser. No. 60/015,678 filed Apr. 18, 1996.

1. Field of the Invention

The present invention relates to a method for generating a screened reproduction of a contone image by means of an electronic screening modulation of the original, and more particularly to a method wherein a lithographic printing plate precursor is scanwise exposed and developed according to the silver salt diffusion transfer process.

2. Background of the Invention

Lithographic printing is the process of printing from specially prepared surfaces, some areas of which are capable of accepting ink and form the printing areas, whereas other areas will not accept ink and form the background areas.

Two basic types of lithographic printing plates are known. According to a first type, so-called "wet" printing plates, either water or an aqueous dampening liquid and ink are applied to the plate surface that includes hydrophilic and hydrophobic areas. The hydrophilic areas are soaked with water or the dampening liquid and are thereby rendered oleophobic while the hydrophobic areas will accept the ink. A second type of lithographic printing plate operate without the use of a dampening liquid and is called "driographic" printing plate. This type of printing plate comprises highly ink repellant areas and oleophilic areas.

Lithographic printing plates can be prepared using a photosensitive lithographic printing plate precursor, referred to herein as an "imaging element". Such an imaging element is exposed in accordance with the image data and is generally developed thereafter so that a differentiation results in ink accepting properties between the exposed and unexposed areas.

From the above it will be clear that lithographic printing is only capable of reproducing two tone values because the areas will either accept ink or not. Thus lithographic printing is a so-called "binary" process. As mentioned hereabove, in order to reproduce originals having continuously changing tone values by such processes, halftone screening techniques are applied. Yet the rendering of small dots still presents an important problem as is explained hereinafter.

Figure 1:
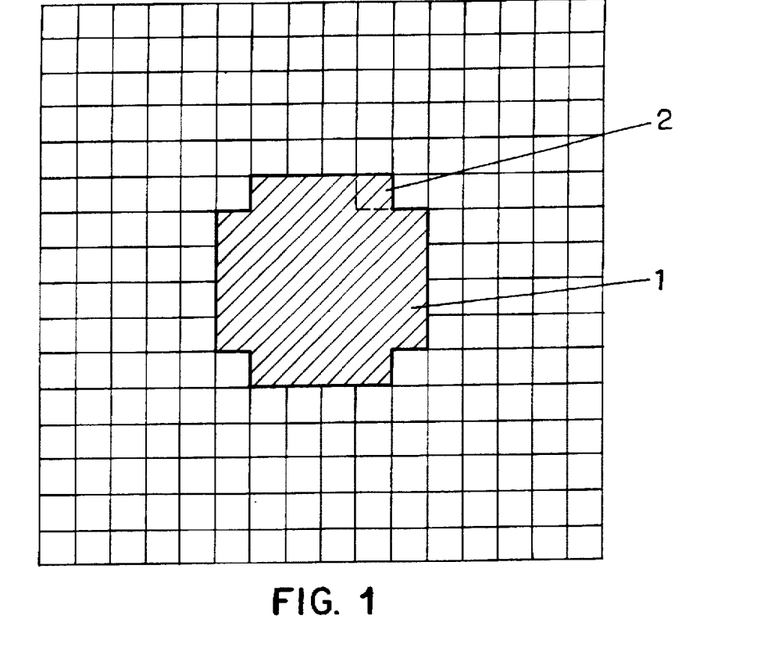
FIG. 1 illustrates an arrangement of clustered microdots as used in amplitude modulation.
Figure 2:
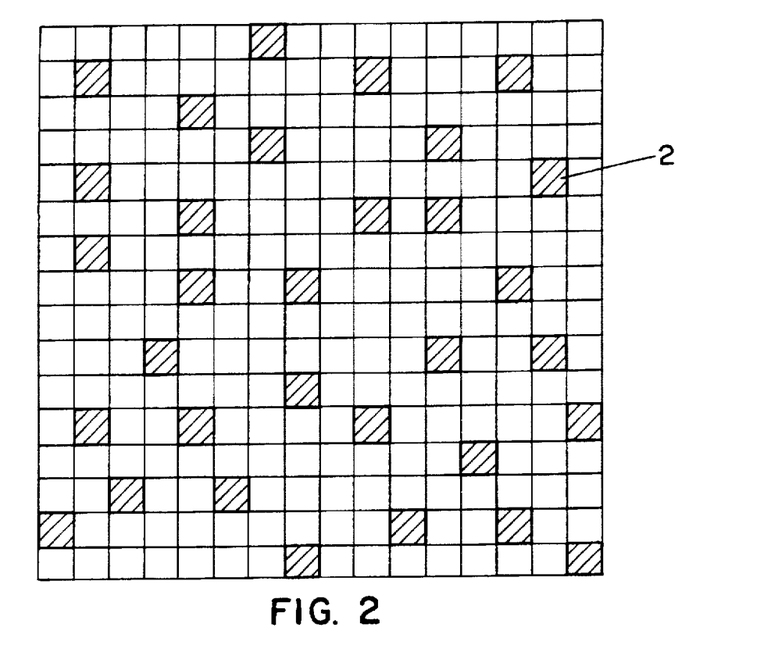
FIG. 2 illustrates an arrangement of dispersed microdots as used in frequency modulation screening.

A halftoning technique converts a density value into a geometric, distribution of binary dots that can be printed. Two main classes of halftoning techniques have been described for use in the graphic arts field. These two techniques are known as "amplitude modulation screening or autotypical screening, or dot size modulation screening" (abbreviated as AM) and "frequency modulation screening or stochastic screening" (abbreviated as FM). Reference is made to FIGS. 1 and 2, wherein FIG. 1 illustrates an arrangement of clustered microdots (in a bitmap) as used in amplitude modulation; and wherein FIG. 2 illustrates an arrangement of dispersed microdots (in a bitmap) as used in frequency modulation. For a clear understanding, most of the relevant technical terms used in the present application are explained in a separate chapter at the beginning of the detailed description (see later on).

A specific approach in AM-halftoning uses a so-called euclidean dotshape and is commercially applicated in filmrecorders of the Selectset and Accuset series of the company Bayer-Miles Inc., Agfa division. This approach, called "Agfa Balanced Screening"—shortname "ABS", tradename™—, is protected by e.g. EP 0 454 274 A2 (in the name of AGFA Corporation), describing a method for controlling halftone dot shape during dot growth. More specifically the shape of the halftone dot during dot growth changes from circular at the origin of 0% to square at 50% and back to circular at 100%. Thus, the dots grow through a shape sequence of round at the beginning, through rounded square to square at 50%, and the back to rounded square to finally round again at 100%.

Laser imagesetters and "direct to plate" recorders expose halftone images on graphic arts film and plates by means of laser beam scanning and modulation. The faithful rendition of halftone levels, represented by binary bitmap images, is difficult to achieve because the image is distorted by the gaussian intensity distribution of the laser beam and the sensitometric characteristics of the film and plate material. This distortion changes the rendition of the halftone levels, small dots—either positive or negative—in highlights and shadows may be rendered too small or print unevenly or not at all. Generally, a black dot in a white area is called "a highlight", whereas a white dot in a dark area is called "a shadow".

From the previous explanation follows that a need exists for a halftoning system that provides a consistent reproduction of the halftone dots across the full tone scale.

From this point of view, recently a new approach in halftoning has been disclosed in EP-A-95.203.148.2 (filed by Agfa-Gevaert at 17.11.95) and uses, especially in extreme regions of the tone scale, compact halftone dots having a ratio of peripheral length to surface area which is minimal. According to this application, preferably the shape of said halftone dots is square or rectangular.

In general, it may be stated than in screening often a compromise has to be taken between conflicting interests: e.g. either a reduced graininess (especially problematic in the midtones), either a reproducability of extreme tones (especially problematic in dispersed highlights and shadows). It is a big advantage of the present invention to bring a surprisingly good compromise, in particular a good reproducability of extreme tones and also a reduced graininess in the midtones.

OBJECTS OF THE INVENTION

It is an object of the present invention to provide a method for generating a screened reproduction of a contone image with improved reproduction characteristics, also called gradation characteristics, especially in the highlight and shadow tones of an image.

It is also an object of the present invention to provide a method for making a lithographic printing plate with improved printing properties, e.g. an extended tone scale in print, by means of screening an original and exposing a printing plate precursor.

Further objects of the present invention will become clear from the description hereinafter.

SUMMARY OF THE INVENTION

According to the present invention, there is provided a method for generating a screened reproduction of a contone image comprising the steps of:

screening said contone image to obtain screened data representative for tones of said contone image, and suitable for driving exposure of microdots on a radiation sensitive imaging element;

exposing said microdots according to said screened data by at least one set or plurality p of radiation beams b, characterised in that at a point in time t during said exposure at least two radiation beams of said set of radiation beams impinge on a particular microdot m.

According to the present invention there is also provided a method generating a screened reproduction of a contone image on a lithographic printing plate comprising the steps of:

screening said contone image to obtain screened data representative for tones of said contone image, and suitable for driving exposure of microdots m on a radiation sensitive imaging element;

exposing said microdots according to said screened data by at least one set or plurality p of radiation beams b, on a lithographic printing plate precursor having a surface capable of being differentiated in ink accepting and ink repellant areas upon exposure, and an optional development step, wherein said exposure uses a set p of radiation beams b the number of which is varied in accordance with a particular tone to be reproduced.

BRIEF DESCRIPTION OF THE DRAWINGS

The present invention is illustrated by way of example and without an intention to limit the invention thereto with the following drawings:

FIG. 6.1 illustrates a single-spot multibeam recording according to the present invention using one plurality or set of light beams impinging on a particular microdot;

FIG. 6.2 illustrates a single-spot multibeam recording according to the present invention using one set of light beams consecutively impinging on each microdot of a scanline;

FIG. 6.3 illustrates a single-spot multibeam recording according to the present invention using three sets of light beams each impinging simultaneously on particular microdots of a same scanline;

FIG. 6.4 illustrates a single-spot multibeam recording according to the invention using three sets of light beams each impinging simultaneously on a particular microdot of different scanlines;

FIG. 7.1 illustrates a single-spot multibeam recording according to the invention using one set of light beams wherein each light beam impinges on a different microdot of a same scanline;

FIG. 7.2 illustrates a single-spot multibeam recording according to the present invention using one set of light beams wherein each of said light beams impinges on a different microdot of a different scanline;

FIG. 7.3 illustrates a single-spot multibeam recording according to the present invention using two sets of light beams wherein each of said light beams impinges on a different microdot of a particular scanline;

DETAILED DESCRIPTION OF THE INVENTION

The description given hereinbelow mainly comprises five chapters, namely (i) terms and definitions used in the present application, (ii) preferred embodiments for screening, (iii) preferred embodiments for making a lithographic printing plate, (iv) comparative experiments, and (v) further applications of the present invention.

Explanation of terms and definitions used in the present description

As an aid to understanding the discussion to follow, the meaning of some specific terms applying to the specification and to the claims are explained.

Although the present application is mainly directed towards the use of light sensitive imaging elements, also heat sensitive imaging elements are included, so that often a more generic wording "radiation sensitive imaging element" is used, or shortly "imaging element". By analogy, the wording "light beam(s)" has to be interpreted as comprising the broader wording "radiation beam(s)".

Each "image", including as well an image resulting from scanning a hardcopy original as well as a so-called synthetic image—e.g. generated by a computer program—, is composed of a number of picture elements, shortly called "pixels or PEL's"

These pixels can be thought to be arranged on a grid. Usually, such a grid has a square structure; however, often a rectangular grid is used; sometimes another kind of grid—e.g. hexagonal grid—is used; optionally even a stochastic grid may be used.

The number of pixels in an image depends on the spatial resolutions along the directions of the sampling grid; e.g. in mainscan or fastscan direction X and in subscan or slowscan direction Y. In general, spatial resolution—expressed in dots per inch, shortly dpi—quantifies the spatial discretization of an image.

Tonal resolution is quantified by a value representative for the number of positive levels after the tonal quantization of a pixel.

A "contone or continuous tone image" is a representation of a spatial sampling of a original, optionally having a multiplicity of tone levels, and comprises information representative for optical density values—e.g. density, transmission, opacity—of said original. This information is laid down in digital data, either explicitly (previously) generated or implicitly generated (on the fly). A contone image may comprise a matrix of elements; each element—further called PEL—can take C different contone values, wherein the number C of possible values must be greater than two C>2; e.g. C=256).

In the present application, most of the described features are explicitly oriented towards a contone image, but they also explicitly or implicitly apply to a so-called "multiple tone or multitone image". By the term multitone image is ment an image with a rather moderate number of tone levels, comprising less tone levels than a contone image, but more than a halftone image.

Halftoning or screening is a technique in which an image with a first tonal resolution is transformed into an image with a second tonal resolution in such a way that i) the second tonal resolution is lower than the first tonal resolution, and ii) at least part of the tonal quantization error that is introduced by this process is spatially distributed.

A "halftone image" is the result of a halftoning proces applied on a contone image and thus comprises a halftoned representation by digital data of a contone original. A halftone image may comprise a matrix of elements—each of which is further called "halftone element" or HEL—, wherein the number of possible values H of said elements is lower than the corresponding number of contone levels C (so H<C). A halftone image can be rendered by halftone dots, which generally may be clustered halftone dots (cfr. AM; FIG. 1) or which may be dispersed halftone dots (cfr. FM; FIG. 2); or even "dispersed clustered halftone dots" (cfr. CristalRaster, trade mark of Agfa-Gevaert).

A "halftone image" is the result of a halftoning technique applied to a contone original and comprises a representation by digital data of a contone original. A halftone image may be represented by a matrix of elements, wherein the number of possible values H of said elements is lower than the corresponding number of contone levels C (H<C).

A "micro dot" or "elementary dot" or "recorder element"—generally abbreviated as "REL or rel"—is the smallest spatially addressable unit on a recording device or the smallest space on an image carrier that can get an optical density, or ink repellency, different from neighbouring locations. A rel can have any form, such as rectangular or hexagonal, or circular, or square.

In connection with photographic materials which were subjected to a process comprising a screening of an original, a modulated "halftone dot" is the smallest image unit that is rendered on said photographic material after exposing and processing said material. The size of a halftone dot can be equal to the size of a rel or may comprise several rels. A halftone dot can have any form, but usually its shape is square or rectangular.

A halftone dot is obtained by a mechanical, an optical, and/or an electrical manipulation of the recording beam of the recording device. Although a halftone dot can consist of precisely one rel, preferably said halftone dot consists of a [p*q] matrix of rels, wherein p represents 2 or a greater integer and q represents 1 or a greater integer.

Although p and q can have different values they are often equal, yielding a halftone dot that is essentially a square, or optionally a rectangle if the mainscan-addressability X differs from the subscan-addressability Y.

A tone value on a tone scale or grey scale relates to a degree or percentage of occupance or "coverage", sometimes also called "percentage value" or "occupied capacity"; e.g. a coverage of 50%.

The wording "single-spot multibeam recording" refers to a recording which uses at least two radiation or light beams (hence "multibeam") focused at a particular place on an imaging element (hence "singlespot"), either by simultaneously impinging on a particular place, either by consecutively impinging on same particular place (comprising a microdot).

As still other important terms may appear in the following description, said terms will be explained at their first introduction.

Preferred embodiments for implementing a screening method according to the present invention First, attention may be drawn on the screening or halftoning technique itself. Generally, if an original is screened, the image information is converted into tone or grey values, normally between 0 for e.g. a solid-tone and 255 for e.g. white. For the resulting halftone image rendered on an imaged element—film, paper, aluminium, etc.—, however, there are only two possible states: the image area is either black or white (in case of a black and white imaging element). The continuous-tone signal produced by a scanner (between 0 and 255; or 1 and 256) must therefore be transformed into a binary value (1 or 0). The simplest possibility is to code all grey values above a certain threshold value with 1 and the remainder with 0. It is obvious that, in this way, a large part of the image information is lost.

In order to obtain a better reproduction result, various screening techniques are suitable. These techniques have already been described extensively in an earlier patent application EP-A-94.203.587 (in the name of Agfa-Gevaert), so that in the present description no explicite and extensive replication is necessary.

Attention is given now to the exposure system itself, in order to explain more deeply the modulation of the scanwise exposure of an imaging element according to the present invention. As an example, but non-limitative as to the scope of protection, a method for preparing a printing plate is known in which the method comprises the steps of informationwise exposing an imaging element and thereafter processing the exposed imaging element. Such a method is known as a "computer to plate" method, and can be carried out with the aid of different types of scanning devices, e.g. a capstan type scanning device, a flat bed type scanning device or an internal drum type scanning device. A full description of such scanning devices can be found e.g. in EP-A-95.200.713, so that in the present description any explicite and extensive replication is superfleous.

Still in order to explain more deeply the modulation of the scanwise exposure of an imaging element according to the present invention, a description is given for a acousto-optic modulator using a laser diode. Hereto, reference may be given to FIG. 5 and to U.S. Pat. No. 4,577,932 (assigned to Creo Electronics Corporation) which relates to a single frequency amplitude modulation of an acousto-optic modulator using a laser diode.

Figure 5:
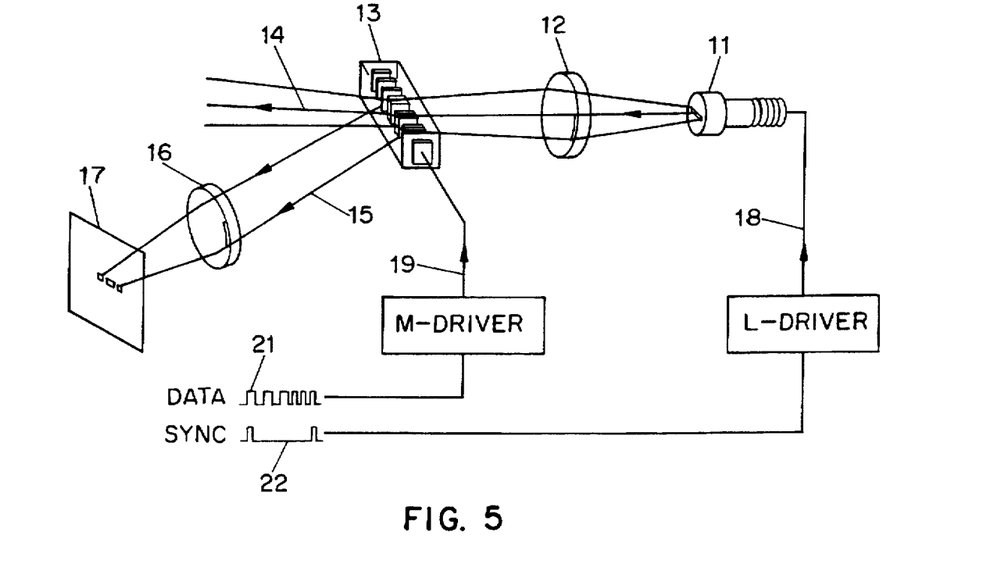
FIG. 5 illustrates a single frequency, multi-spot modulator according to the state of the art.
Figure 6A:
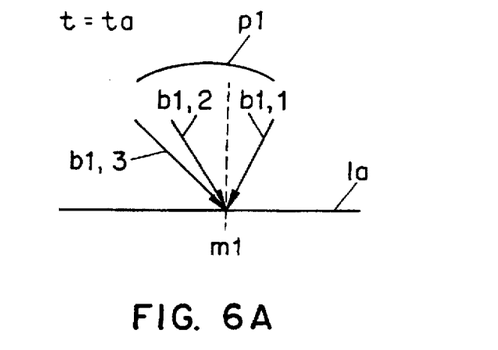
Figure 6B:
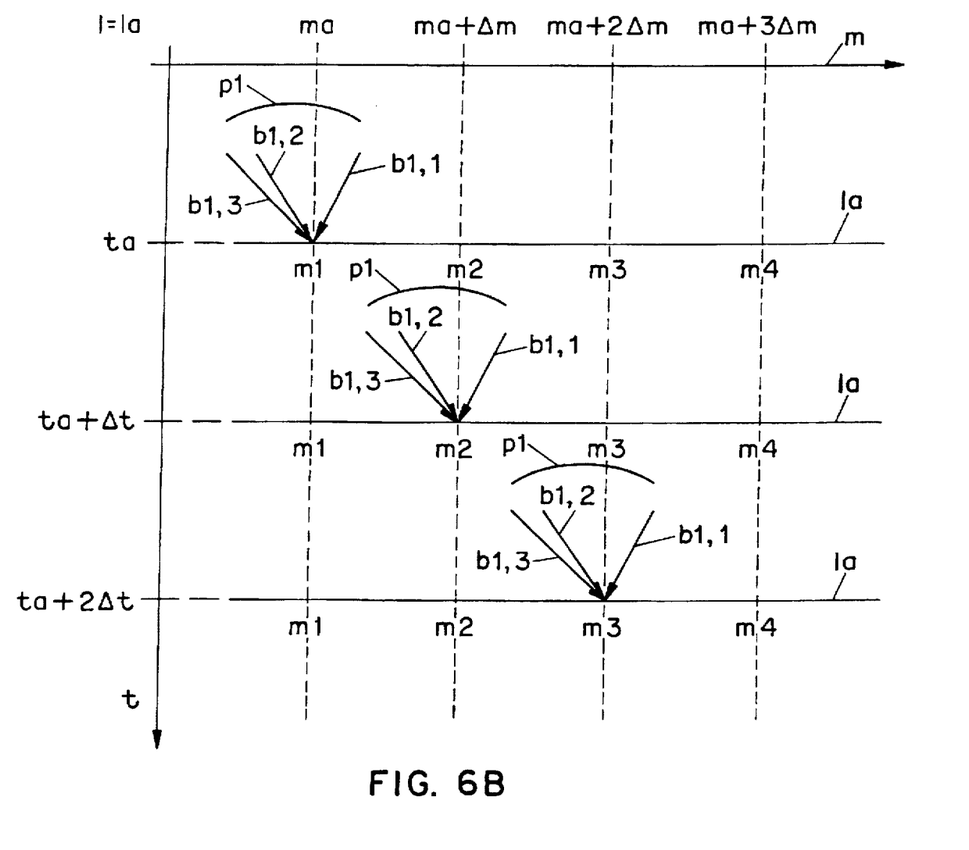
Figure 6C:
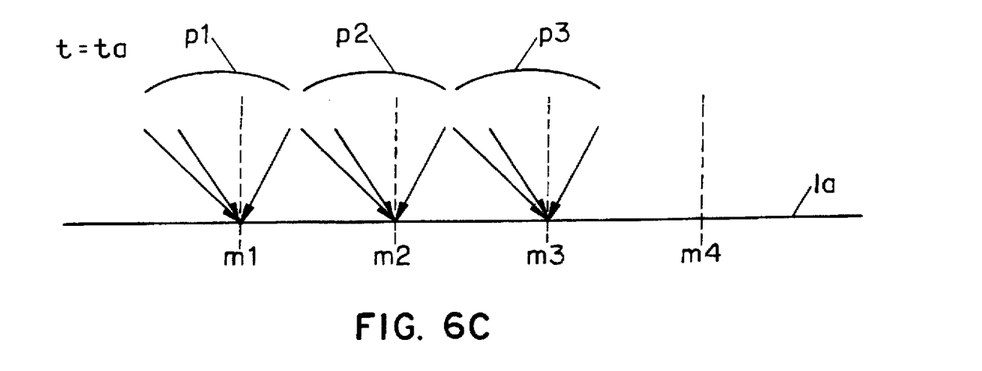
Figure 6D:
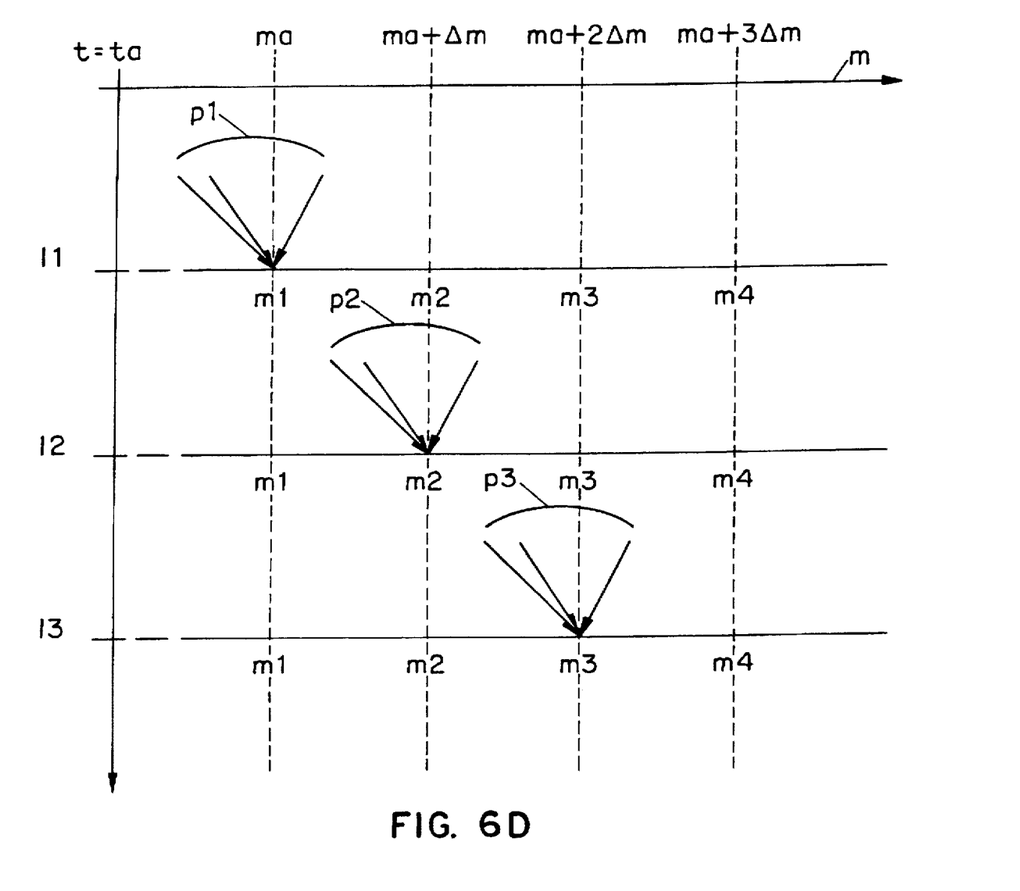
Figure 7A:
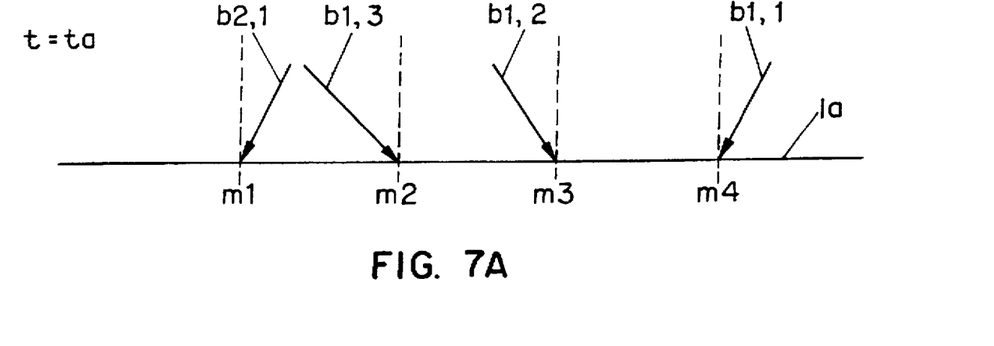
Figure 7B:
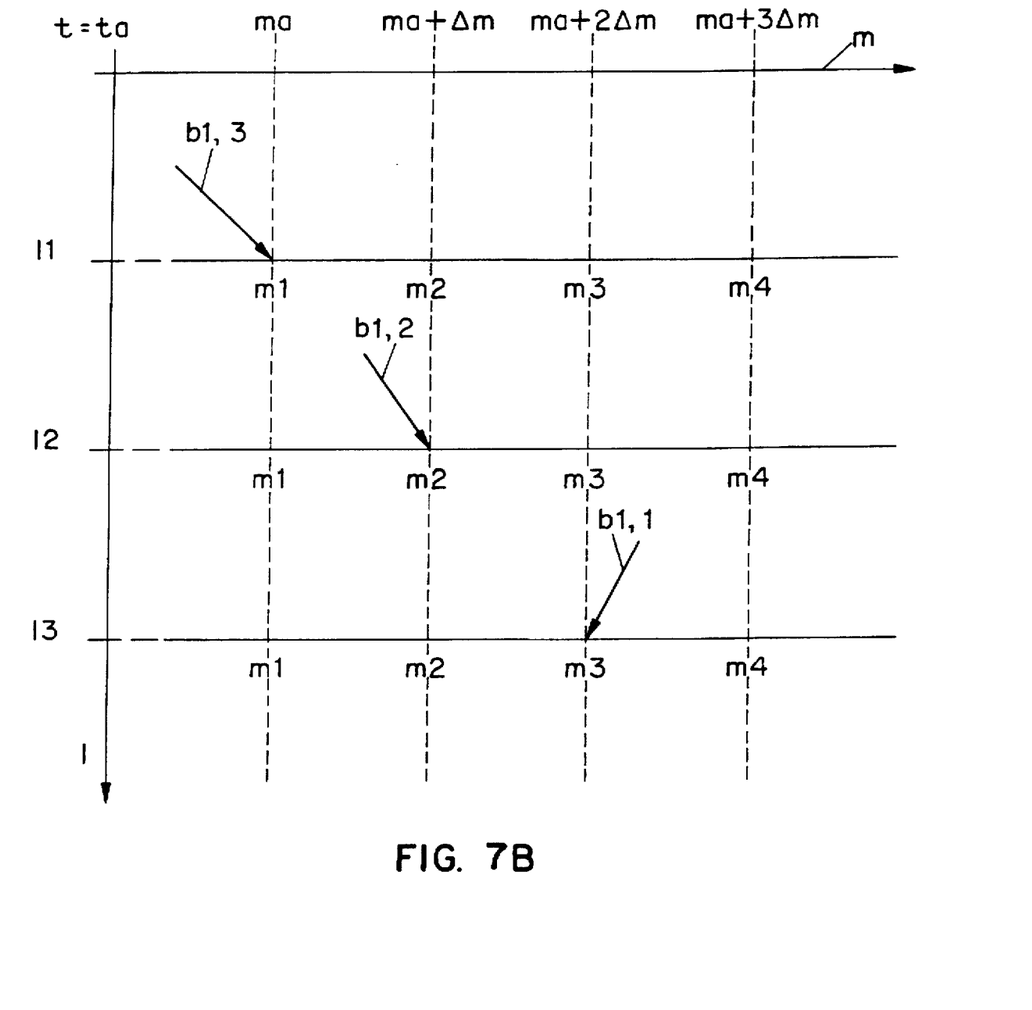
Figure 7C:
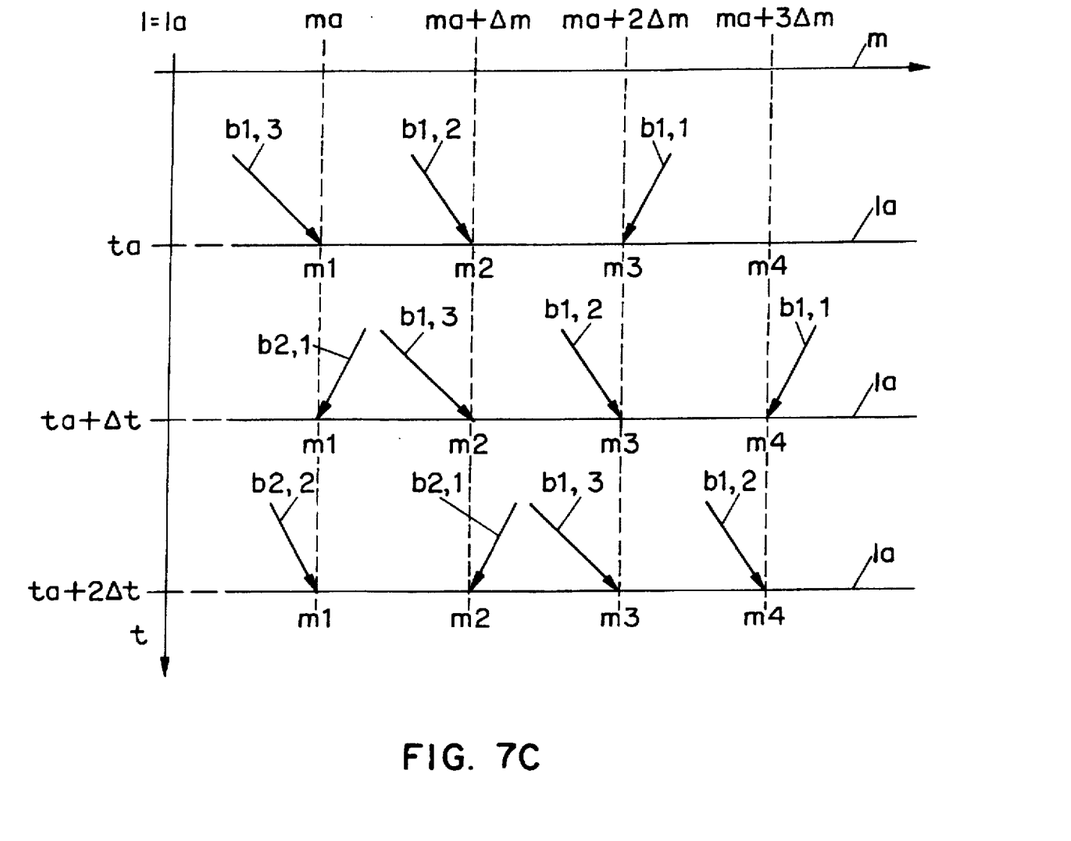

Referring now to FIG. 5, the embodiment consists of a laser diode 11, a focussing lens 12 placed to project the image of the laser diode onto an acoustic-optic modulator 13. The undiffracted beam 14 from the acousto-optic modulator is not used. The diffracted beam 15 is focussed by a second lens 16 to form an image onto a radiation- or light-sensitive material, also called imaging element 17. Diode 11 may be a pulsed laser diode, such as available from RCA or Sanders Associates, USA. The modulator is available e.g. from Isomet, USA or Crystal Technology, USA. Laser diode driver 18 and modulator driver 19 are items well known to those versed in the art.

In operation, the desired DATA pattern 21 is fed to the acousto-optic modulator 13 via modulator driver 19. The bit pattern modulates a carrier which generates an acoustic wave inside modulator 13. When all the data bits 21 are converted to acoustic energy, SYNC pulse 22 generates a narrow light pulse out of laser diode 11. This light pulse images the acoustic field onto light sensitive material 17 and forms a permanent record of data pattern 21. By moving imaging element 17, a new bit pattern can be recorded.

It is known in the art that an acousto-optic modulator can be used for high speed recording of data on a light-sensitive material in laser printers, plotters and optical data storage devices. In order to increase data rate, it is possible to work on parallel inputs. Generally, a multi-spot modulator is faster than a single spot modulator since it records a plurality of bits simultaneously. Also known is prior art which generates multiple spots with acousto-optic modulators by using multiple frequencies simultaneously—such as the multi-spot modulators sold by the Isomet Corporation, U.S.A.—or by using multiple transducers simultaneously.

Figures 3, 4:
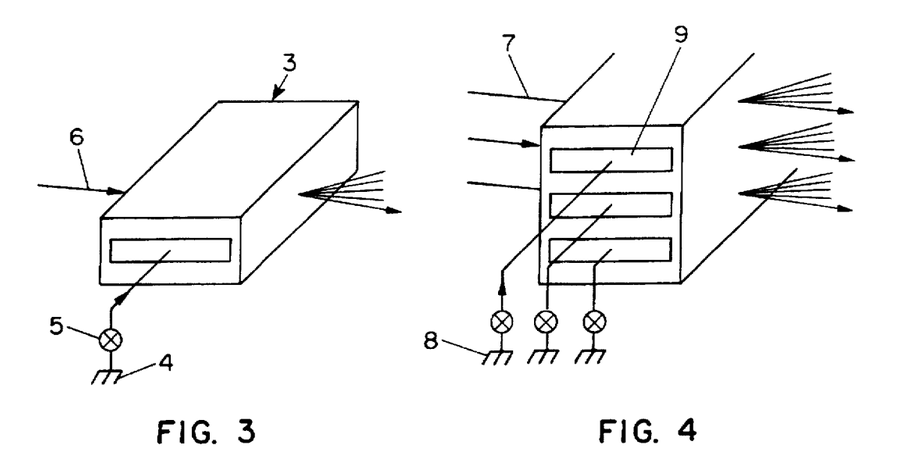
FIG. 3 illustrates a mono-beam, multi-frequencies modulator according to the state of the art.
FIG. 4 illustrates a multi-beams, multi-frequencies, multi-channels modulator according to the state of the art.

For example A.A. Opto-Electronics (Versailles, France) produces several acousto-optic modulators for lasers, classified as "mono-beam, multi-frequencies modulators" (cfr. FIG. 3), "multi-channels modulators", "multi-beams, multi-channels, multi-frequencies modulators" (cfr. FIG. 4). A monp-beam, multi-frequencies modulator 3 (cfr. FIG. 3) uses a unique transducer, which is fed with v mono-frequency signals 4 (e.g. up to v=10) at the same time, mixed in a high frequency input signal 5; each frequency diffracts a part of the optical input beam 6 in a direction according to Bragg relations; well known in the art. A multi-beams, multi-channels, multi-frequencies modulator uses w different transducers (up to w=6) one above another; each transducer being fed by a single frequency and diffracts a part of the optical input beam in a direction according to Bragg relations. FIG. 4 shows a combination of multiple input beams 7, v frequencies signals 8 and w channels 9 (e.g. 10 beams for each of 6 channels).

As explained before, in order to increase the recording speed, prior art techniques often use plural light beams, which may result from plural light sources—e.g. plural lasers—or from a single light source combined with one or more modulators (e.g. in order to generate a plurality or set of diffracted light beams). Precisely with the aim of increasing the recording speed, said prior art techniques do impinge said plural light beams on different locations on an imaging element. Such diffracted light beams then can be deflected through discrete angular ranges to produce so-called "tandem- or comb-lines" on an imaging element.

Now, we have found a novel screening method which does impinge several light beams on a same location on an imaging element. It may be evident that this application, contrary to said prior art, is not aimed at increasing a recording speed, but is aimed at improving the reproduction characteristics of an images, as it has already been mentioned in the objects of the invention.

According to a first preferred embodiment of the present invention (cfr. FIG. 6.1), a method for generating a screened reproduction of a contone image comprises the steps of:

screening said contone image to obtain screened data representative for tones of said contone image, and suitable for driving exposure of microdots on a radiation sensitive imaging element;

exposing said microdots according to said screened data by at least one set or plurality p of radiation beams b, characterised in that at a point in time t during said exposure, at least two radiation beams of said set of radiation beams impinge on a particular microdot m. Of course, in relation to FIGS. 3 to 5, in a hardware implementation of the present invention, additional focussing means (not shown in particular) have to be integrated in the recording apparatus.

The just mentioned embodiment also can be reformulated in terms of PEL's, HEL's and REL's, thus reading as follows: A method for generating a rendered halftone image of a contone image comprising the steps of i) screening (incl. e.g. some dithering) all pixels PEL of said contone image (or "contone original") to obtain screened data in terms of halftone elements HEL; ii) reproducing said halftone elements HEL on an imaging element by means of an exposure, using a plurality of light beams b; characterised in that at a point in time t during said exposure for each "active" HEL—meaning that its value is not zero—at least two of said light beams converge and strike substantially a same microdot m or REL.

It may be clear that, in first instance all of said light beams converge and strike substantially a same microdot m or REL at a common centre of gravity.

In a second preferred embodiment of the present invention, said microdots are arranged in clustered halftone dots; thus related to so-called AM-screening (cfr. FIG. 1).

In a third preferred embodiment of the present invention, said microdots are arranged in dispersed halftone dots; thus related to so-called FM-screening (cfr. FIG. 2).

In the following paragraphs of the present description, many preferred embodiments of the invention will be disclosed. In order to be as clear as possible, attention will be drawn on several drawings (e.g. FIGS. 6.1–6.4; 7.1–7.3; 8), wherein each individual drawing illustrates a particular embodiment.

A general overview of these drawings indicates that: i) some drawings (e.g. FIGS. 6.1, 6.3, 7.1) illustrate one arbitrary scanline (say 1a) at an arbitrary instant of time (say ta); ii) some drawings (e.g. FIGS. 6.2, 7.3) illustrate one scanline (say 1a) at different instants of time (say ta+$\Delta$t); and iii) that some drawings (e.g. FIGS. 6.4, 7.2, 8) illustrate different scanlines (say 11, 12, 13) at one instant of time (say ta).

In a further preferred embodiment of the present invention (cfr. FIG. 6.2), said exposure is a scanwise exposure, comprising consecutively exposing by said one set or plurality (e.g. p1) of light beams (e.g. b1.1 to b1.3) of each microdot of a scanline (e.g. 1a). In this embodiment all microdots (e.g. m1 to m4) of a scanline thus are exposed consecutively by a same set of light beams.

In a further preferred embodiment of the present invention, which is illustrated in FIG. 6.3, said exposure uses at least two sets (p1, p2) of light beams each of which impinges simultaneously on different microdots (m1, m2) of a same scanline (1a).

In a further preferred embodiment of the present invention, said exposure uses at least two sets (p1, p2) of light beams each of which impinges simultaneously on a particular microdot from different scanlines (11, 12); see FIG. 6.4.

In reference to FIG. 7.1, another preferred embodiment of the present invention comprises a method for generating a screened reproduction of a contone image comprising the steps of:

screening said contone image to obtain screened data representing tones of said contone image in terms of halftone dots;

reproducing said halftone dots on an imaging element by means of an exposure, using in sequence a set of light beams b, characterised in that at a point in time t during said exposure each of said light beams strikes substantially a different microdot m or rel of a same scanline (cfr. FIG. 7.1) or of different scanlines (cfr. FIG. 7.2).

This method can be interpreted as being a modification to a foregoing embodiment, modified in that at a point in time (say t=ta) during said exposure each light beam strikes a consecutive or successive microdot m of a same scanline (e.g. 1a) or of a different scanline (e.g. 11, 12, 13 . . . ).

In a still further preferred embodiment of the present invention, a modification is introduced in that at a point in time (ta) during said exposure, at least two individual light beams (bi.bj) of one of said sets (p) of light beams impinge on a different microdot (mi.mj) of a scanline 1, so that after exposure all microdots of said scanline have been impinged by all individual light beams. In reference to FIG. 7.3, most of the named topics can be explained in detail. On the vertical axis of FIG. 7.3 are illustrated some exemplary time-steps, indicated by ta, ta+$\Delta$t and ta+2$\Delta$t, on the horizontal axis of said FIG. 7.3 are illustrated some indicative microdots, indicated by ma, ma+$\Delta$m, ma+2$\Delta$m, ma+3$\Delta$m.

At a first point in time ta, one light beam b1.3 from set p1 is impinging on microdot m1 of scanline 1a. At the same point in time ta, another light beam b1.2 from the same set p1 is impinging on another microdot m2 of the same scanline 1a; etc.

At a "next" point in time ta+Δt, said light beam b1.3 from set p1 is impinging on microdot m2 of said scanline 1a. At the same point in time ta+Δt, light beam b1.2 from the same set p1 is impinging on microdot m3 of the same scanline 1a; etc. At the same point in time ta+Δt, light beam b2.1 from another set p2 is impinging on microdot m1 of the same scanline 1a; etc.

According to this method a sequentially iterating over consecutive intervalls or periods of time Δt occurs until all microdots of a scanline have been striked or rendered at least once. This includes an iteration of n exposures on a same scanline 1 so that after n exposures all microdots of a scanline have been impinged.

For the ease of understanding, in FIG. 7.3 so-called "next" beams (as e.g. b1.3–b1.2–b1.1) are sketched to impinge on so-called "next" microdots (here e.g. m1, m2, m3), but such is not intended to be restricting the scope of this invention. Indeed, for people skilled in the art, it might be quite evident that even a stochastic or random or a pseudo-random order could be carried out. Yet, in general, due to common digital electronic controls, an optional spread of the exposure in time and/or in place (cfr. FIGS. 7.1 to 7.3) has to be synchronised by appropriate clock signals.

A special advantage of an embodiment according to FIGS. 7.1 to 7.3 is that they do not suffer from any optical interference resulting from two or more beams impinging simultaneously on a same microdot.

Therefor, in an embodiment according to FIGS. 6.1 to. 6.4 special means—for sake of simplicity, such means have, not been figurated in the accompanying drawings—have to be foreseen in order to prevent any disturbing interference.

In a further preferred embodiment the basic method of this application is modified in that at a point in time t during said exposure, at least two individual light beams of one of said set of light beams impinge on a different microdot m, wherein said set of light beams b is used in sequence characterised in that at a point in time t during said exposure impinges on a different microdot of a same scanline.

In a further preferred embodiment said different microdots of a same scanline are consecutive or successive microdots m of a same scanline.

In a still further preferred embodiment said consecutive or successive microdots m of a same scanline are immediatley consecutive or successive microdots m of a same scanline.

A further preferred embodiment sequentially iterates over consecutive intervalls or periods of time until all microdots of a scanline have been rendered at least once.

Figure 8:
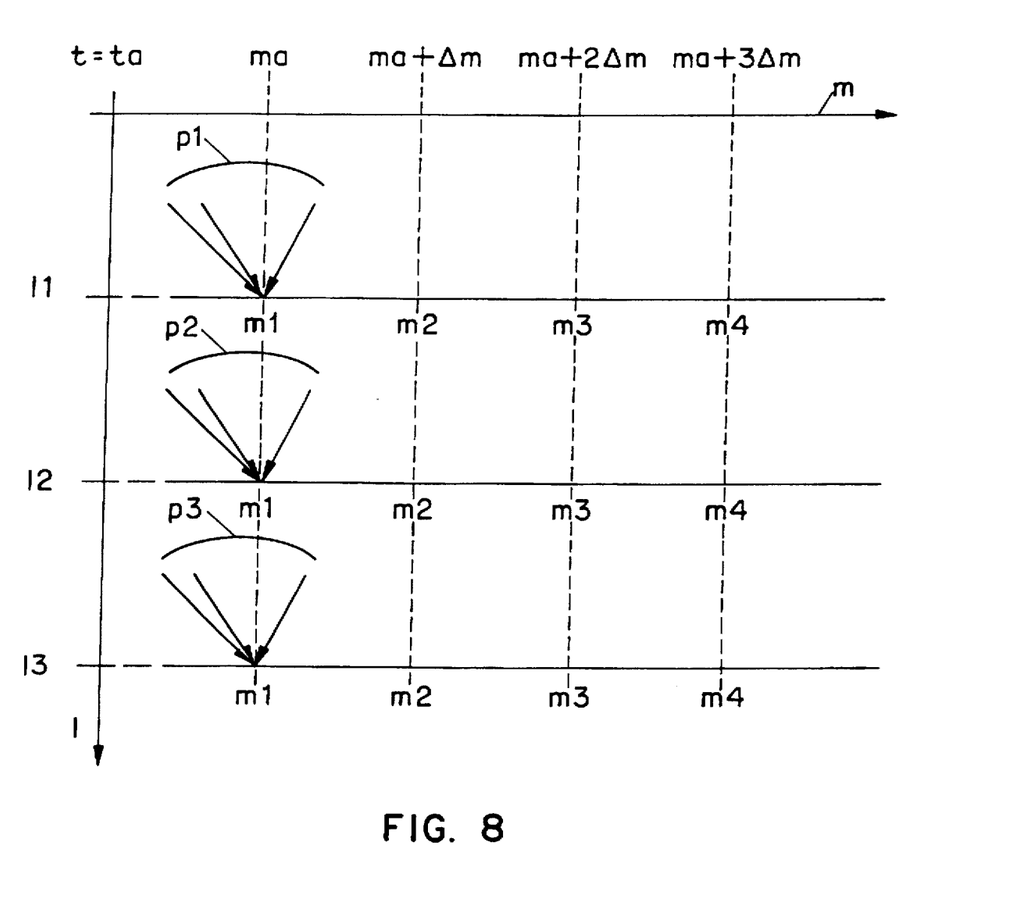
FIG. 8 illustrates a single-spot multibeam recording according to the present invention using a multiple scanwise exposure, or comb-like or tandem-like scanwise exposure.

It may be selfspeaking for people skilled in the art, that in some preferred embodiments the exposure is a multiple scanwise exposure,—also called "comb-like or tandem-like"—scanwise exposure. Herewith is ment a simultaneously exposing of at least two individual scanlines, each comprising a series of microdots, and is carried out by a juxtaposition of at least two simultaneous single scanwise exposures. This brings a remarkable reduction of time, and thus an extra opportunity for more profits. Reference is made to FIG. 8, which illustrates a single-spot multibeam recording according to the present invention using a multiple scanwise exposure, or comb-like or tandem-like scanwise exposure.

In still another embodiment of the present invention, at least two of said radiation or light beams have a mutual different power available.

For example, if four beams b1–b4 would be available, with distinctive highest available powers of respectively P1, P2, P3 and P4, wherein e.g. $P4=0.5(P3)=0.25(P2)=0.125(P1)$, then even if only a binary modulation should be possible—namely only the off-state and the on-state of each beam should be considered—, already 16 different levels of total power could be generated, in particular:

$(P1)*0$ resulting from all beams b1–b4 being off,
$(P1)*(1/8)$ resulting from only beam b4 being on,
$(P1)*(2/8)$ resulting from only beam b3 being on,
$(P1)*(3/8)$ resulting from only beams b3 and b4 being on,
$(P1)*(4/8)$ resulting from only beam b2 being on,
$(P1)*(5/8)$ resulting from only beams b2 and b4 being on, etc
... up to
$(P1)*(15/8)$ resulting from all beams b1–b4 being on.

According to a preferred embodiment of the present invention, a method for generating a screened reproduction of a multitone image comprises the steps of: frequency modulation screening said multiple image to obtain screened data representing tones of said multitone image in terms of halftone dots; reproducing said halftone dots on an imaging element by means of a scanwise exposure; characterised in that said scanwise exposure for rendering a halftone dot is intensity modulated.

We shall not further detail the basic concept of intensity modulation as the same has already been disclosed in the specification and drawings of EP-A-95.200.711 (filed by Agfa-Gevaert on 22.03.95) and which is taken to be included herein by reference.

Thus in a preferred embodiment of the present invention, an exposure for rendering halftone dots is varied in acccordance with a particular tone to be reproduced. In practice, an intensity of a halftone dot for rendering halftone dots of low tones is increased relative to halftone dots of mid tones, whereas an intensity of a halftone dot for rendering halftone dots of high tones is decreased.

Figure 9:
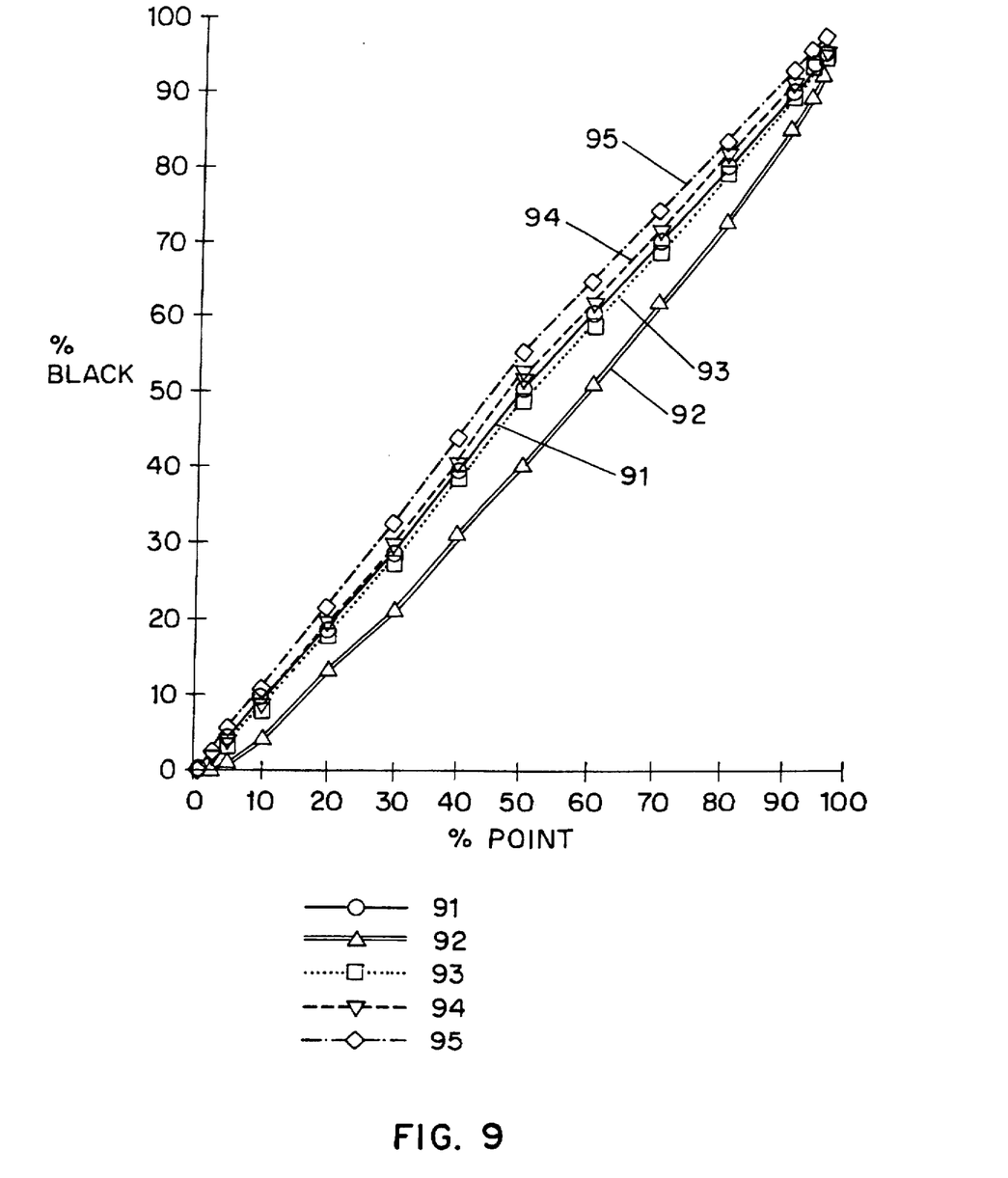
FIG. 9 illustrates comparative experiments wherein said scanwise exposure for rendering a halftone dot is modulated according to the present invention.

It may be indicated that said screened data represent—still uncompensated—tones of a contone original or image, that one or more light sources may be used, and that said modulating is carried out in accordance to a location of corresponding halftone dots on a tone scale of said imaging element. Thus, the present application does not intend to modulate the intensity of the exposure by controlling the drive current of a laser, but by changing the number of impinging light beams (impinging on a microdot or rel) and optionally also the sequence of impinging light beams (cfr. FIG. 9 to be explained later on).

Because in one part of a tone scale of an imaging element or imaging system the number of halftone dots may be low and in another part of said tone scale the number of halftone dots may be high, different compensation data may be applied, said compensation data are indicated as being "depending on the the location" of the corresponding halftone dots on said tone scale of said imaging element. Said compensation data with respect to a tone value on a tone scale thus relate to a percentage of occupance or coverage.

In a further preferred embodiment of the present invention, said modulating comprises the steps of capturing compensation data with respect to a tone value on a tone scale; and combining said screened data with said compensation data to obtain compensated screened data.

It may be stated that in this embodiment, and also in the immediately following embodiment, a compensating manipulation is carried out on the screened data before using them in the exposing step.

In other embodiments to be described later on, said compensating manipulation will be carried out in real time ("on the fly").

In a further preferred embodiment of the present invention, an exposure for rendering halftone dots is varied in accordance with the number of neighbouring halftone dots.

Aside from the above-mentioned modulation of power and aside from the above-mentioned modulation of intensity, also a tone selective time modulation of said set or plurality of beams can be implemented. Herein an exposure time for rendering halftone dots of low tones is lengthened relative to halftone dots of mid tones, whereas an exposure time for rendering halftone dots of high tones is shortened. We shall not further detail the basic concept of such time modulation as the same is already disclosed in the specification and drawings of aforementioned EP-A-95.200.713 (filed by Agfa-Gevaert on 22.03.95) and which is taken to be included herein by reference.

Preferred embodiments for making a lithographic printing plate

According to a further preferred embodiment of the present invention, a method for generating a screened reproduction of a contone image on a lithographic printing plate comprises the steps of:

screening said contone image to obtain screened data representative for tones of said contone image, and suitable for driving exposure of microdots m on a radiation sensitive imaging element;

exposing said microdots according to said screened data by at least one set or plurality p of radiation beams b, on a lithographic printing plate precursor having a surface capable of being differentiated in ink accepting and ink repellant areas upon exposure, and an optional development step, wherein said exposure uses a set p of radiation beams b the number of which is varied in accordance with a particular tone to be reproduced.

A thorough explanation of further preferred embodiments will follow in the next paragraphs. Yet, a thorough explanation of empirical results is postponed to the description of comparative experiments (cfr. the later FIG. 9).

In a still further preferred embodiment for generating a screened image on a lithographic printing plate, according to the present invention, said scanwise exposure uses at least one set p of light beams b, characterised in that at a point in time t during said exposure, each of said sets of light beams impinges simultaneously on a particular microdot m. In reference to FIG. 6.1 illustrated is the case of precisely one set p1, comprising beams b1.1–b1.3 which all impinge simultaneously on a same microdot m1. In a thus preferred embodiment said scanwise exposure comprises consecutively exposing each microdot of a scanline 1. In reference to FIG. 6.3 illustrated is the case of e.g. three set p1–p3, wherein set p1 comprising beams b1.1–b1.3, set p2 comprises beams b2.1–b2.3, etc. wherein all individual beams of a same set impinge simultaneously on a same microdot.

By doing so, beams b1.1–b1.3 all impinge at a certain time instant on a particular microdot m1, whereas at the same instant beams b2.1–b2.3 all impinge on another particular microdot m2. In relation to FIG. 6.3 it has to be stated, as may be clear already from the foregoing description, that it is not necessary that consecutive sets impinge on immediately neighbouring microdots.

In a still further preferred embodiment for generating a screened image on a lithographic printing plate, according to the present invention, the basic method of this application is modified in that at a point in time t during said exposure, at least two individual light beams of one of said sets of light beams impinge on a different microdot m.

Herein said set of light beams b is used in sequence, meaning that at a point in time t during said exposure, at least two individual light beams of one of said sets of light beams impinge on a different microdot of a same scanline. In order to be as clear as possible, reference is made to FIGS. 7.1 to 7.3, which do not need a further explanation, because of the close relationship regarding previous embodiments.

Imagewise exposure in accordance with the present invention may proceed by a scanwise exposure carried out by an exposure unit continuously or discontinuously moving across the imaging element during said scanwise exposure. Preferably, the imagewise exposure impinges e.g. a laser directly on the printing plate precursor. Examples of lasers that can be used in connection with the present invention are e.g. HeNe lasers, Argon ion lasers, semiconductor lasers, YAG lasers e.g. Nd-YAG lasers etc..

Imagewise exposure in accordance with the present invention also may be performed by first exposing according to said screened data an intermediate photographic film of high contrast, generally a high contrast silver halide film. After exposure by a light beam modulated according to the halftone image, the film is developed and dried. An example of such an intermediate photographic film (as imaging element) is marketed by Agfa-Gevaert NV under the name AGFASTAR. Then the imaged photographic film is used as a mask for exposing a lithographic printing plate precursor to a conventional light source in a camera exposure or contact exposure. Thereafter, the imaged lithographic printing plate precursor is developed, so that a differentiation results in ink accepting properties between the exposed and unexposed areas.

It may also be clear that said scanwise exposing can be carried out by a light source with a visible spectrum or with an infrared spectrum or with an ultraviolet spectrum, depending on the actual imaging elements.

Sensitivity spectra for imaging elements which can be used in the method according to the present invention may be found in EP-A-94.203.326.

In a still further preferred embodiment said imaging element is a lithographic printing plate precursor having a surface capable of being differentiated in ink accepting and ink repellant areas upon scanwise exposure and a development step.

In a further preferred embodiment of the present invention said lithographic printing plate precursor contains a silver halide emulsion layer and an image receiving layer containing physical development nuclei and wherein subsequent to said scanwise exposure said lithographic printing plate precursor is developed using an alkaline processing liquid in the presence of developing agent(s) and silver halide solvent(s).

In a further preferred embodiment of the present invention said printing plate precursor contains on a hydrophilic surface of a support in the order given a layer of physical development nuclei and a silver halide emulsion layer and wherein subsequent to said scanwise exposure said lithographic printing plate is developed using an alkaline processing solution in the presence of a developing agent and a silver halide solvent and subsequently treating said developed printing plate precursor to remove the layer(s) on top of said image receiving layer, thereby uncovering said silver image formed in said image receiving layer.

In a still further preferred embodiment according to the present invention, said lithographic printing plate precursor contains a silver halide emulsion layer and an image receiving layer containing physical development nuclei and wherein subsequent to said scanwise exposure said lithographic printing plate is developed using an alkaline processing liquid in the presence of developing agent(s) and silver halide solvent(s).

Examples of photosensitive lithographic imaging elements are, for example, the silver salt diffusion transfer—generally referred to as DTR—materials are disclosed e.g. in aforementioned EP-A-95.200.711.

One process for obtaining a lithographic printing plate by means of a DTR process uses an imaging element comprising, in the order given, a support with a hydrophilic surface such as a grained and anodized aluminium foil, a layer of physical development nuclei and a silver halide emulsion layer. An example of such an imaging element is marketed by Agfa-Gevaert NV under the name LITHOSTAR. The imaging element of the present embodiment is imaged using a scanning exposure followed by a development step in the presence of development agent(s) and silver halide solvent(s) so that a silver image is formed in the physical development nuclei layer. Subsequently the silver halide emulsion layer and any other optional hydrophilic layers are removed by rinsing the imaged element with water so that the silver image is exposed. Finally the hydrophobic character of the silver image is preferably improved using a finishing liquid comprising hydrophobizing agents.

A second type of mono-sheet DTR material comprises on a support in the order given a silver halide emulsion layer and an image receiving layer containing physical development nuclei e.g. a heavy metal sulphide such as PdS. The image receiving layer is preferably free of binder or contains a hydrophilic binder in an amount of not more than 30% by weight. Subsequent to imagewise exposure, the mono-sheet DTR material is developed using an alkaline processing liquid in the presence of developing agents e.g. of the hydroquinone type and/or pyrazolidone type and a silver halide solvent such as e.g. a thiocyanate. Subsequently, the plate surface is neutralised with a neutralising liquid. Lithographic printing plate precursors of this type are marketed by Agfa-Gevaert NV under the names SETPRINT and SUPERMASTER.

Alternatively, a lithographic printing plate may be prepared from a "heat mode" recording material as a lithographic imaging element. Upon application of a heat pattern in accordance with image data and optional development the surface of such heat mode recording material may be differentiated in ink accepting and ink repellent areas. The heat pattern may be caused by a light source such as a laser. The heat mode recording material includes a substance capable of converting the light into heat. Heat mode recording materials that can be used for making a lithographic imaging elements are described for example in EP-A-92201633, DE-A-2512038, FR-A-1473751, Research Disclosure 19201 of April 1980 and Research Disclosure 33303 of January 1992.

In some heat mode recording techniques, rather high powers are applied; e.g. 10 W. In order not to destruct the imaging element, the temperatures involved require a very severe physical control, which inherently is substantially costly. It is a further big advantage of the present invention, that by using a sequential generating of well-defined parts of power instead of a simultaneous applying of the total power, any desastreous destruction of imaging material can be avoided.

A further preferred embodiment relating to heat mode recording techniques can be disclosed now. As it may be known from the state of the art, in such techniques often a infra-red laser of high power is used; e.g. Nd:YAG-10 W. Because such laser emits at a specific wavelength of 1064 nm, the laser beam can not be seen by human perception. In case that this laser beam should touch the human eye, sereous damage could be effected. In order to avoid this, in a particular embodiment of the present invention, a frequency shift of the laser beam is carried out—e.g. by means of a frequency doupling—so that a small part of the laser power (say 5%) is shifted towards a humanly perceptable wavelength (e.g. from 1064 nm to 532 nm; constituting a green beam). By doing so, the operator or the service technician is warned continuously, so that he can take precautions for personal safety.

Description of experiments

In order to clearly demonstrate some remarkable advantages of the present invention, now the results will be disclosed regarding some comparative experiments wherein the scanwise exposure for rendering a halftone dot was modulated according to the present invention.

In relation to FIG. 9 an experiment was carried out under following conditions: on a well calibrated imagesetter Selectset Avantra, Red Laser Diode Films SFP 812 G were exposed at at a high resolution (in order to be very distinctive ) of 3600 dpi and 150 lpi by autotypical screening ABS (version 10.2) and processed according to Avantra 44P—comprising developer G101C and fixer 333C—(all available from AGFA-GEVAERT). Evidently, the imagesetter was not driven in a standard way, but rather in a dedicated mode for special services; herein appropriate modifications were introduced relating to the modulator, the number of beams, the sequence of impingement, etc.

In FIG. 9, the horizontal axis or abscis gives settings of "point %" (ranging from 0% to 100% coverage of the tone scale), whereas the vertical axis or the ordinate gives "% black" measured with a 0.01D—precision-densitometer Macbeth type TR 924 and recalculated by the so-called Murray-Davies equation.

By the formula of Murray-Davies (cfr. "Monochrome Reproduction in Photoengraving", J. Franklin Institute, June 1936, vol. 221, pp. 721–744) is ment:

$$\% \text{ black} = \frac{1 - 10 \exp[-(Dt - Db)]}{1 - 10 \exp[-(Ds - Db)]} \cdot 100 \text{ [in \%]}$$

wherein

% black represents the percentual area of a halftone dot;

Dt=measured density of a tint;

Ds=measured density of a solid;

Db=measured density measured on a base material (including substratum and optional fog if present).

In said FIG. 9, a "reference line" 91 is drawn which connects points on the graphs which exhibit a 1:1 ratio, meaning that at those points a wanted "point %" (as programmed on a computer for the exposure) coincides with an effective "% black" (as measured on an exposed film).

The remaining curves all illustrate practical experiments carried out on the imagesetter. More in particular, curve 92 was made with exactly one light beam b (comparable to a rather common use of the apparatus), curve 93 was made with exactly one set p of light beams b (cfr. FIG. 6.2), curve 94 was made with two sets p1, p2 of light beams b, and curve 95 was made with three sets p1, p2, p3 of light beams b (cfr. FIG. 6.3).

From this FIG. 9 it may be clearly seen that the halftone dots, more in particular, the endresult of coverage expressed in "% black", can be be influenced remarkably by use of the present invention.

For instance, if necessary, a screened image can be rendered with a rather low profile according to a curve similar to ref. 92; according to a rather linear profile according to a curve like ref. 91; or, according to a rather high profile according to a curve like referral 95. Even a swith from one curve to another—e.g. in order to compensate for unwanted dot gain or recorder gain—is very well possible and can bring important advantages. This may be extremely useful, as well for lithographic printing plates, as e.g. for thermal systems.

A lot of other comparative experiments were undertaken by the inventor, but the resulting graphs are omitted from the present description in order to reduce the volume of the text and also in order not to confuse the reader.

Some of said other experiments were carried out by stochastic screening; some used only square and rectangular dotshapes; in some experiments at least two individual light beams (bi,bj) of one of said sets (p) of light beams impinged on a different microdot (mi,mj) of a scanline 1, so that after exposure all microdots of said scanline had been impinged by all individual light beams; etc.

Further applicability of the present invention

As mentioned earlier, most of the features disclosed in the present description apply as well to contone images as to multitone images.

The present invention is applicable to improve AM screening, e.g. Agfa Balanced Screening™, but is also applicable to improve FM screening, e.g. CristalRaster™.

The present invention may be applied as well to positive imaging systems as to negative imaging systems.

The present invention provides a method for generating a screened reproduction of a contone image with a minimized loss of tonal range. It also provides an improved halftone rendition so that an optimum number of halftone levels can be obtained on film or plates.

The method described in this invention improves the faithful rendition of small dots by selective correction of small overexposure areas, thus eliminating the need for tightly controlled spot sizes or materials with high gradients. This implies that the correction method described in this invention can be applied to improve the output quality of less expensive laser recording systems, e.g. exposing plates which do not have the steep gradient and short toe characteristics of graphic arts films.

In an imagesetter relative to the present invention, the presence of small dot areas, negative or positive, can easily be detected by a special algorithm to be included in the bitmap creation functions of the so-called "raster image processor" RIP. Said RIP builds a binary bitmap image in memory, representing tone values, before sending the information as individual scan lines to the exposure unit.

The present application also provides a preferred embodiment for carrying out a prior filing, which disclosed a method for generating a screened reproduction of a multiple tone image comprising the steps of frequency modulation screening said multiple image to obtain screened data representing tones of said multiple tone image in terms of halftone dots; reproducing said halftone dots on an imaging element by means of a scanwise exposure, wherein the size of said halftone dot is modulated, by varying the number of microdots (or rels) composing a halftone dot. Preferably, said size modulation of said halftone dots is varied in accordance with a particular tone to be reproduced. Also preferably, said size modulation of said halftone dots is varied in accordance with the number of neighbouring halftone dots. We shall not further detail, as the same is already disclosed in the specification and drawings of EP-A-95.200.712 (filed by Agfa-Gevaert on 22.03.95) and which is taken to be included herein by reference.

In case of a color image, the above described screening process is performed on each of the color separations of the image. Preferably the color image is separated in its Yellow, Magenta, Cyan and Black components. Each of these components may then be screened and used to imagewise expose four lithographic printing plate precursors according to the present invention. Four lithographic printing plates, one for each color separation, will thus be obtained. The color separations can then be printed over each other in register in a lithographic printing machine using the four plates.

In a still further preferred embodiment of the present invention, in extreme zones of the tone scale, the centers of said halftone dots are varied slightly in order to preferably get a good shape of halftone dots, rather than an exact position of the center of halftone dots. In this case, in highlight zones and in shadow-zones some intentional phase adjustment is introduced, meaning that a certain inconsistency is created between the theoretical and actual dot centers, which can be viewed as a "local phase distortion" of the created versus the theoretical halftone dot screen.

In a further embodiment a bitmap is used with a resolution which is higher than the resolution of a raster image processor RIP a nd wherein the resolution of said bitmap is used in a tone selective way, also indicated as being "depending on the the location" of the corresponding halftone dots on the tone scale of said imaging element. For example, suppose that an imagesetter has a X-resolution of e.g. 2400 dpi and a bitmap has a X-resolution of e.g. 3600 dpi. Then, it is possible to control the lowtones—or highlights if said imagesetter relates to a so-called "positive" working system— and hightones or shadows at 3600 dpi and the midtones at 2400 dpi.

Although the current description primarily mentioned rectangular or square screen cells, for people skilled in the art, also parallelogram shaped screen cells, or screen cells having a hexagonal, or a rhomboidal shape can be applied according to the methods of the present invention.

Whereas the present description has been oriented mainly to lithographic printing plates, also aplications within other technical fields are possible, e.g. flexography, screen printing, electrography, etc.

Vareous modifications will become possible for those skilled in the art after receiving the teachings of the present disclosure without departing from the scope thereof.

We claim:

1. A method for generating a screened reproduction of a contone image on a lithographic printing plate comprising the steps of:

screening said contone image to obtain screened data representative for tones of said contone image, and suitable for driving exposure of microdots m on a radiation sensitive imaging element; and exposing said microdots according to said screened data by at least one set or plurality p of radiation beams b, on a lithographic printing plate precursor having a surface capable of being differentiated in ink accepting and ink repellant areas upon exposure, and an optional development step, wherein said exposure of each microdot uses a set p of radiation beams b the number of which is varied in accordance with a particular tone to be reproduced.

2. A method according to claim 1 wherein said lithographic printing plate precursor contains a silver halide emulsion layer and an image receiving layer containing physical development nuclei and wherein subsequent to said scanwise exposure said lithographic printing plate is developed using an alkaline processing liquid in the presence of developing agent(s) and silver halide solvent(s).

* * * * *

UNITED STATES PATENT AND TRADEMARK OFFICE
CERTIFICATE OF CORRECTION

PATENT NO. : 5,783,356

DATED : July 21, 1998

INVENTOR(S) : Bosschaerts et al.

It is certified that error appears in the above-identified patent and that said Letters Patent is hereby corrected as shown below:

Title page, item [60] Related U.S. Application Data: "Provisional application No. 60/015618 Apr. 18, 1996" should read -- Provisional application No. 60/015678 Apr. 17, 1996 --;

Column 1, line 6, "Apr. 18" should read -- Apr. 17 --;

Column 1, line 47, "geometric." should read -- geometric --;

Column 4, lines 13-16, "Explanation of terms and definitions used in the present description" should read -- ¶Explanation of Terms and Definitions Used in the Present Description --;

Column 4, line 54, "C>2;" should read -- (C>2; --;

Column 5, lines 58-59, "Preferred embodiments for implementing a screening method according to the present invention" should read -- ¶Preferred Embodiments for Implementing a Screening Method According to the Present Invention --;

UNITED STATES PATENT AND TRADEMARK OFFICE
CERTIFICATE OF CORRECTION

PATENT NO. : 5,783,356

DATED : July 21, 1998

INVENTOR(S) : Bosschaerts et al.

It is certified that error appears in the above-identified patent and that said Letters Patent is hereby corrected as shown below:

Column 11, lines 16-18, "Preferred embodiments for making a lithographic printing plate" should read -- ¶Preferred Embodiments for Making a Lithographic Printing Plate --;

Column 14, line 4, "doupling" should read --doubling--;

Column 14, line 10, "Description of experiments" should read -- ¶Description of Experiments --.